United States Patent [19]

Chang

[11] Patent Number: 5,737,511
[45] Date of Patent: Apr. 7, 1998

[54] METHOD OF REDUCING CHIP SIZE BY MODIFYING MAIN WORDLINE REPAIR STRUCTURE

[75] Inventor: Tung Chi Chang, Hsing-Chu County, Taiwan

[73] Assignee: United Microelectronics Corporation, Hsinchu, Taiwan

[21] Appl. No.: 662,682

[22] Filed: Jun. 13, 1996

[51] Int. Cl.[6] .......................... G06F 11/18; G06F 11/20
[52] U.S. Cl. ............................................................. 395/182.05
[58] Field of Search ........................ 395/182.05, 182.03; 371/10.2

[56] References Cited

U.S. PATENT DOCUMENTS

| | | | |
|---|---|---|---|
| 4,635,232 | 1/1987 | Iwahashi et al. | 365/200 |
| 4,748,597 | 5/1988 | Saito et al. | 371/10.2 |
| 4,827,452 | 5/1989 | Toyama et al. | 365/200 |
| 4,937,790 | 6/1990 | Sasaki et al. | 365/230.01 |
| 5,034,925 | 7/1991 | Kato | 365/200 |
| 5,227,999 | 7/1993 | Ihara et al. | 365/200 |
| 5,243,570 | 9/1993 | Saruwatari | 365/201 |
| 5,267,205 | 11/1993 | Hamada | 365/200 |
| 5,285,417 | 2/1994 | Maeda | 365/200 |
| 5,337,277 | 8/1994 | Jang | 365/200 |
| 5,487,040 | 1/1996 | Sukegawa et al. | 365/200 |

OTHER PUBLICATIONS

M. Morris Mano, Digital Design 2nd ed., 1991, pp. 72–78, 88–98, Prentice–Hall, Inc.

*Primary Examiner*—Robert W. Beausoliel, Jr.
*Assistant Examiner*—Scott T. Baderman
*Attorney, Agent, or Firm*—Barnes, Kisselle, Raisch, Choate, Whittemore & Hulbert, P.C.

[57] ABSTRACT

A method and apparatus for effecting repair or replacement of defective circuits in a solid state memory chip that includes the use of logic circuits to replace the fuse circuits. Included in the method and apparatus for effecting repair of defective circuits is a circuit for switching redundancy spare cells in place of main wordline cells. A logic circuit is used in order to reduce the chip size by getting rid of a fuse in the X-decoder. When a redundancy circuit is used, the logic circuit automatically generates a $\overline{RM}$ signal to control the X7 predecoder to turn off the main wordline. Included in an apparatus for effecting replacement of main circuits in a solid state memory chip are a first inverter for receiving a first signal indicating whether a predetermined circuit is selected, a second inverter connected to the output of first inverter for providing an inverted output of the output of the first inverter, a third inverter connected to the output of the second inverter for providing an inverted output of the output of the second inverter, a first circuit for receiving a first fixed input and a second varying input having a first enabling state and a second disabling state and providing an output having an enabling state and a disabling state and a second circuit for receiving a first input from the output of the third inverter and a second input from the output of the first circuit and providing an enabling output whenever the main circuit is selected and a disabling output whenever the main circuit is to be replaced.

18 Claims, 3 Drawing Sheets

X7 - predecoder:

X - decoder:

Architecture:

5,737,511

METHOD OF REDUCING CHIP SIZE BY MODIFYING MAIN WORDLINE REPAIR STRUCTURE

BACKGROUND OF THE INVENTION

1. Field of the Invention

The present invention pertains to solid state memory chip repair and more particularly to circuits for replacing memory cells or switching in spare memory cells when defective cells have been located.

2. Related Prior Art

In the design of RAM (random access memory) semiconductor chips, redundancy circuits are frequently used to repair failed main wordline circuits. FIG. 1 illustrates a typical X7-predecoder circuit comprised of inverters 8 and 10. Whatever signal is present at the input to inverter 8, the same signal, either high or low, will be present at the output of inverter 10. Inverter 8 changes a high to a low and a low to a high. Inverter 10 changes the low output of inverter 8 back to a high and the high output of inverter 8 back to a low. In other words, the combination of inverter 8 and inverter 10 provides an amplified output of an input signal.

FIG. 2 illustrates an X-decoder circuit having a three input NAND gate 12 with its output 14 bifurcating to the gates of FET's 16 and 18. The outputs of FET's 16 and 18 are connected through a fuse 20 to inverter 22. The output 24 of inverter 22 is the $\overline{MWL}$ signal. Fuse 20 is used to isolate inverter 22 so that the $\overline{MWL}$ signal is open circuited or the main wordline is taken out of the system and is to be replaced. In prior art systems, when a defective main wordline circuit is located, it is necessary to use fuse 20 as illustrated in FIG. 2 in an X-decoder. When a failed main wordline circuit needs to be replaced or repaired, it is necessary to burn the fuse such that the $\overline{MWL}$ signal is disabled.

FIG. 3 illustrates a two page architecture for a RAM with X-decoders. Ram cell 30 has an X-decoder 32 and RAM cell 34 has an X-decoder 36. Illustrated on X-decoders 32 and 36 are fuses 38A through 38H on X-decoder 32 and fuses 38I through 38P on X-decoder 36. As illustrated, the fuses require a significant area on the chip within the X-decoders.

Integrated circuit wafers are manufactured with extra or spare memory circuits to allow for a small percentage of manufacturing defects. The circuits are tested to determine whether any of the "first choice" main wordline circuits are defective. Defective circuits are then replaced by functioning "back up" circuits, which would have been extra if all "first choice" circuits were non-defective.

Once testing was complete defective circuits would be cut out and then logic associated with this part of the circuit will replace the failed memory cells with the "back up" cells.

Using standard techniques a polycrystalline silicon line is blown up with a laser beam. The appropriate wave length is used to heat the silicon and cause an explosion, or semi-explosion which melts or vaporizes the silicon and opens up the line.

The prior art method uses polysilicon. To remove a defective memory cell the poly line lead is heated and gets so hot it will vaporize. Any remainder reacts with the ambient and becomes silicon dioxide. Silicon dioxide in this process is non conductive. If this same kind of process is performed using a laser to heat aluminum, an aluminum oxide is formed and this is semi-conductive. It is a conductive ceramic which can never really be etched out by being burnt by a laser. It does not make for a perfect high resistance path. There is always a little bit of current leakage or potential leakage.

If laser burning is not used, the use of poly fuses with multilevel metalization requires a great deal of oxide etch in order to clear the required oxide off of the polysilicon fuses. The oxide can be on the order of four or five microns thick for a four level metal device. This requires very complex etch processes in order to overcome this problem, including the addition of pattering steps. This also requires increased area due to the pattern an etch bias required to perform such and etch.

The process just described is sufficient if the thickness of the oxide is less than one to two microns. The problem with this process is when multiple level metalization is patterned from putting four or more layers of metal on the circuit. This results in a large amount of oxide over the poly fuses. The design process would utilize the top level of metalization to make the fuse.

In producing an integrated circuit, pattern definition and circuit etching is done at several levels, some levels containing metal as circuit components. When a repair is to be done, a laser beam is used to open up the particular fuse that is desired. However, when a metal link is used, the laser beam may leave a metal slag associated with typical high energy laser ablation type fuses that is semi-conductive.

Thus, the utilization of fuse circuits for placing redundancy circuits in operation requires complicated processes that are costly in both manufacturing time and expense.

SUMMARY OF THE INVENTION

The present invention provides a method and apparatus for effecting repair or replacement of defective circuits in a solid state memory chip that includes the use of logic circuits to replace the fuse circuits. Included in the method and apparatus for effecting repair of defective circuits is a circuit for switching redundancy spare cells in place of main wordline cells. In order to reduce the chip size by getting rid of a fuse in the X-decoder, a logic circuit is used. When a redundancy circuit is used, it automatically generates a RM signal to control the X7 predecoder to the left, right block to turn off. This way the fuse in the X-decoder can be saved. As a result, the chip size can be reduced accordingly.

The present invention includes an apparatus for effecting replacement of main circuits in a solid state memory chip that has a first inverter for receiving a first signal indicating whether a predetermined circuit is selected. A second inverter is connected to the output of the first inverter for providing an inverted output of the output of the first inverter. A third inverter is connected to the output of the second inverter for providing an inverted output of the output of the second inverter. A first circuit is provided that receives a first fixed input and a second varying input having a first enabling state and a second disabling state and providing an output having an enabling state and a disabling state. Also included is a second circuit which receives a first input from the output of the third inverter and a second input from the output of the first circuit and providing an enabling output whenever the main circuit is selected and a disabling output whenever the main circuit is to be replaced.

DESCRIPTION OF THE PREFERRED EMBODIMENT

The present invention discloses a new method and apparatus for use in a wordline structure in a random access memory that incorporates a built in redundancy circuit for repair or replacement of defective circuits. In the present invention, through the use of logic circuits, defective main wordline cells may be switched out and redundancy cells may be placed in service without the use of fuse circuits.

In manufacturing integrated circuits, because of their size and complex nature, a certain percentage of memory cells may prove defective. In order to compensate for the possible defects, extra or spare memory cells are designed into the chip. The memory cells are tested to determine their reliability and any cells that are less than reliable are replaced by spare or reliable cells. Occasionally, the number of defective cells exceed the number of spare cells available and the chip must be scrapped. However, the number of chips that must be scrapped amounts to a small percentage of the total manufactured.

On a RAM chip, (random access memory chip), memory cells are arranged in blocks of memory cells, each having its own set of spare cells. The arrangement of a semiconductor chip with primary cells and spare cells is controlled by a row redundancy circuit.

Figure 4:
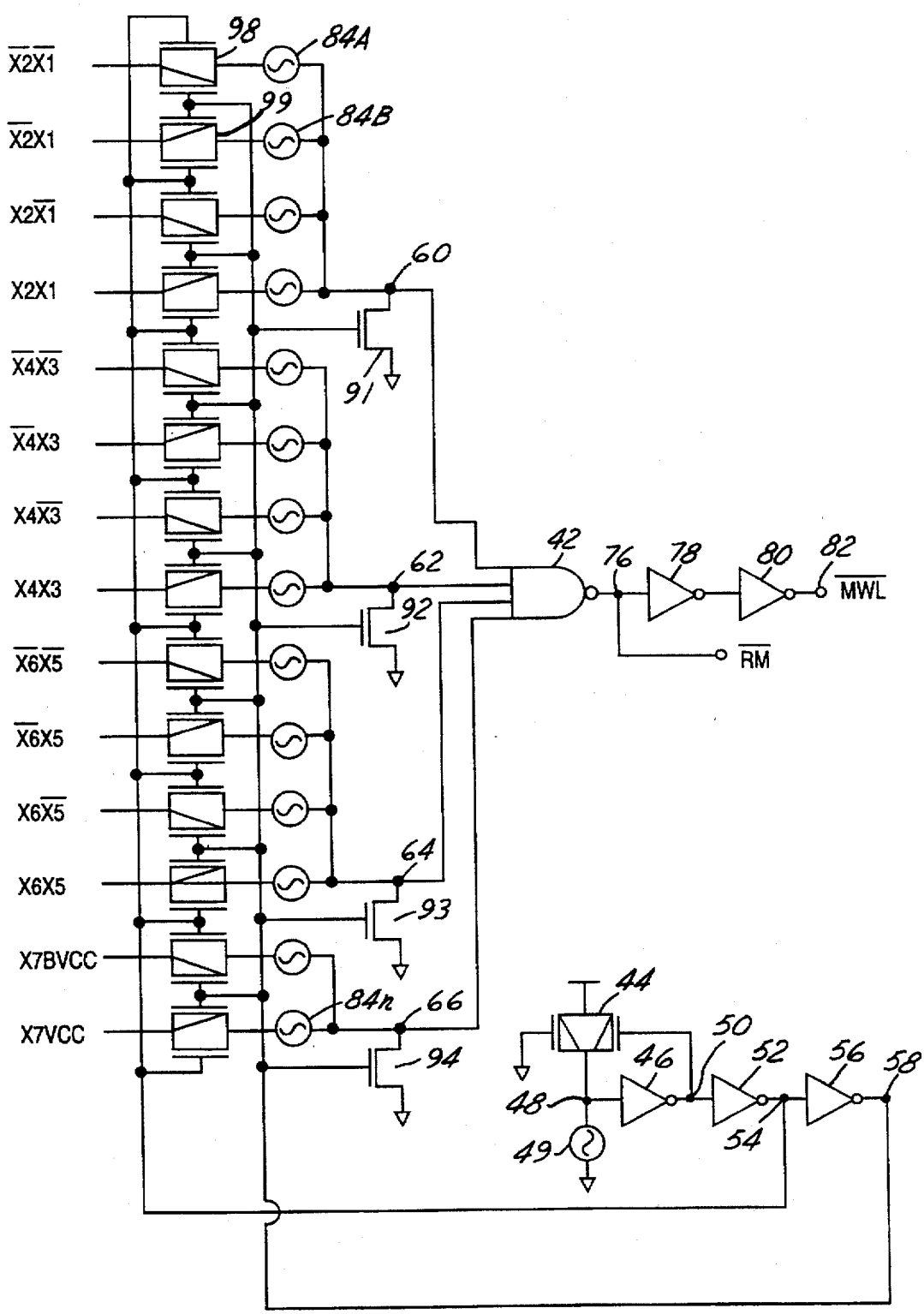
FIG. 4 is a diagram illustrating a row redundancy circuit in the decoder circuit portion of a RAM chip.

Referring now to FIG. 4, a schematic diagram of a row redundancy circuit such as that used in the present invention is illustrated. Four groups are illustrated as feeding NAND gate 42. The first group has four possible inputs, not X2, and not X1, not X2 and X1, X2 and not X1, and X2 and X1. Similarly, the next two groups have identical arrangements for X4 and X3, and for X6 and X5. The final group has only two possible inputs, X7BV$_{cc}$ and X7V$_{cc}$. Under normal operating conditions, a main wordline $\overline{\text{MWL}}$ is selected. The $\overline{\text{MWL}}$ row redundancy is unselected, as shown in FIG. 4, therefore the output of PMOS 44 (P type channel metal oxide silicon), which feeds inverter 46 at node 48 and is connected to ground through fuse 49, is low (L) or zero. Inverter 46 outputs a high (H) or one to node 50, the input to inverter 52 and the source for PMOS 44. The output of inverter 52, node 54 is low. This is the input for inverter 56, which then produces a high or one at node 58. Thus, the channel for P/N MOS devices 98, 99 are OFF, and devices 91, 92, 93, 94 are turned on such that nodes 60, 62, 64, 66 are all low or zero. All four inputs to NAND gate 42 are low so the output to node 76 is high. A low is produced at the output of inverter 78, which is the input to inverter 80, which produces a high or one at node 82. Thus, $\overline{\text{MWL}}$ is high and unselected and the $\overline{\text{MWL}}$ of the redundancy circuit is off.

If defective circuits have been located, the main wordline repair is selected, as shown in FIG. 4. When this occurs, fuse 49 is blown or burned out to change the value at node 48, the output of PMOS 44, is high. Because of the operation of inverters 46, 52 and 56, node 50 becomes low, node 54 becomes high and node 58 becomes low. The channels for P/N MOS devices 98, 99 are turned on, and devices 91, 92, 93, 94 are turned off. Fuses 84A through 84N of any unselected predecoder outputs are burned out. All four inputs to NAND gate 42 are high so the output to node 76 is low. Through the operation of inverters 78 and 80, a low is produced at node 82. Thus, $\overline{\text{MWL}}$ is low and $\overline{\text{RM}}$, at node 76, is low which is the condition when wordline repair is selected.

The operation of a row redundancy circuit has two basic positions, one in which the normal main wordline is selected and one in which a repaired main wordline is selected. First, there is the situation when a normal main wordline, $\overline{\text{MWL}}$ is selected. As illustrated in FIG. 4, the node 48 is connected to V$_{ss}$ through fuse 49. Therefore, the output node 54 is low or the L level. This makes the P/NMOS transmission gate off. This situation makes nodes 60, 62, 64 and 66 low or the L level, which makes the output node 76 of the four input NAND gate 42 high or the H level. Therefore, $\overline{\text{MWL}}$ equals a high or the H level corresponding to the main wordline is off for the redundancy circuit.

As described, $\overline{\text{MWL}}$ of the redundancy circuit is turned off. In other words, the repair operation is not used and the $\overline{\text{RM}}$ is high or at the H level.

Figure 5:
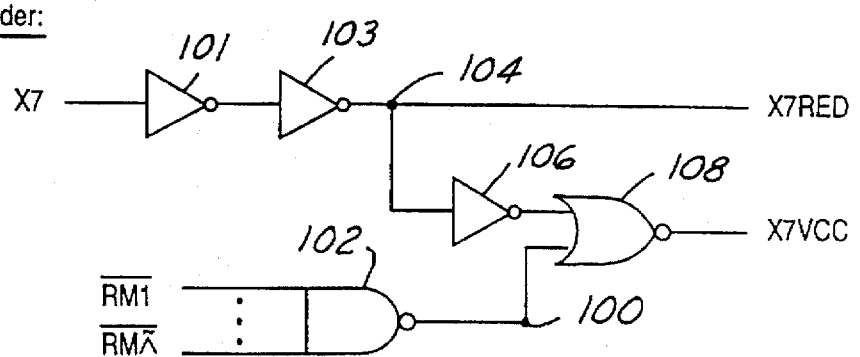
FIG. 5 is a schematic diagram of a X7 predecoder circuit using the circuit of the present invention.

Referring now to FIG. 5, the X7-predecoder of the present invention is illustrated. The present invention includes an apparatus for effecting replacement of main circuits in a solid state memory chip that has a first inverter 101 for receiving a first signal indicating whether a predetermined circuit is selected and a second inverter 103 connected to the output of first inverter for providing an inverted output of the output of the first inverter as is done in the prior art. However, in the present invention, the output of the second inverter is bifurcated at node. One leg of the output operates as it does in the prior art. The second leg includes a third inverter 106 for providing an inverted output of the output of the second inverter. A first circuit 102 is provided that receives a first fixed input and a second varying input having a first enabling state and a second disabling state and provides an output having an enabling state and a disabling state. Also included is a second circuit 108 which receives a first input from the output of the third inverter and a second input from the output of the first circuit and provides an enabling output whenever the main circuit is selected and a disabling output whenever the main circuit is to be replaced.

Figure 1:
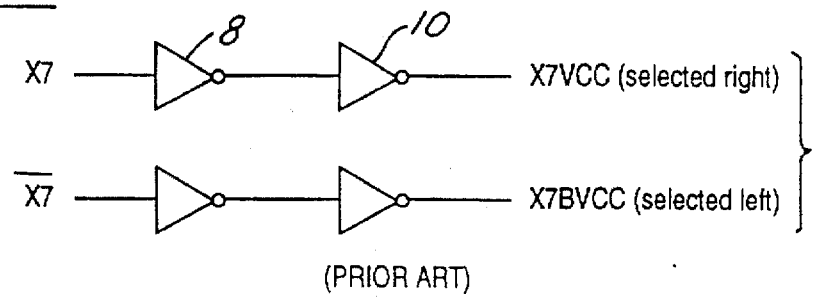
FIG. 1 is a schematic diagram of a prior art X7 predecoder circuit.
Figure 2:
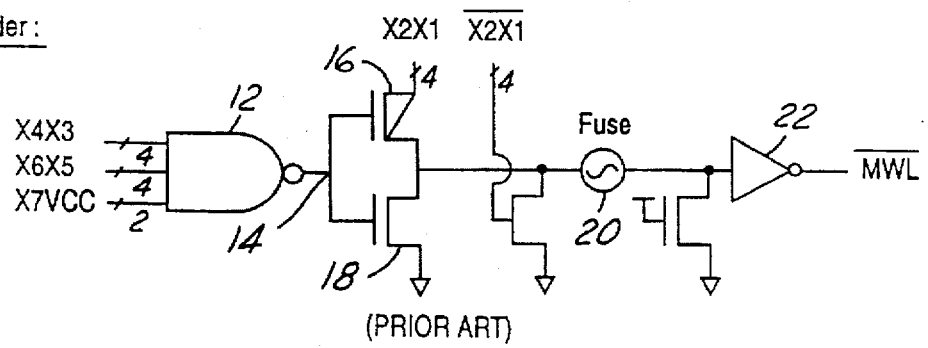
FIG. 2 is a schematic diagram of a selection circuit utilizing a fuse in the selection process as in the prior art.
Figure 3:
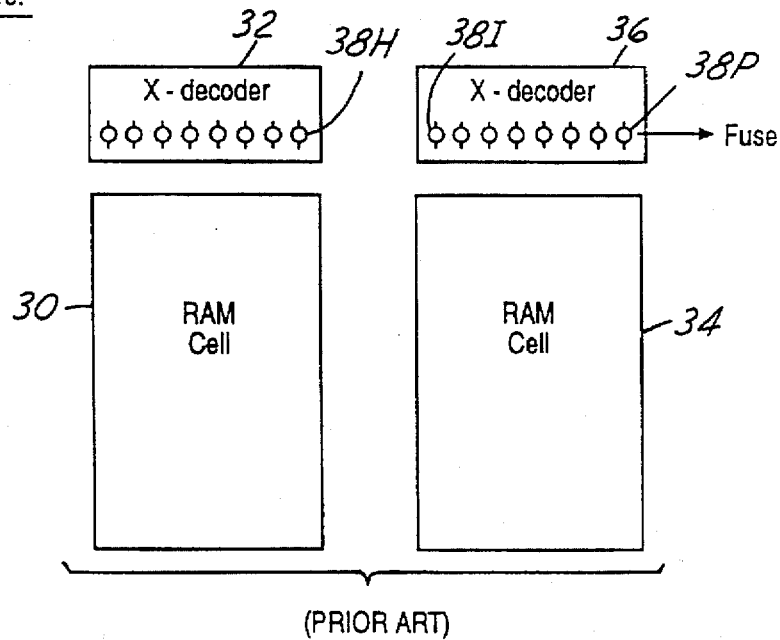
FIG. 3 is a diagram illustrating the location of fuse circuits in the decoder circuit portion of a RAM chip as in the prior art.

Inverter 101 has its output connected to inverter 103. The output at node 104 from inverter 103 is the output signal X7RED and provides the input to inverter 106. The output of inverter 106 provides one input to NOR gate 98. The other input to NOR gate 108 is output 100 of two input NAND gate 102. NAND gate 102 receives one input from the $\overline{\text{RM}}$ signal from the circuit of FIG. 4. The $\overline{\text{RM}}$ output of the circuit of FIG. 4 is connected to the input of NAND gate 102 of FIG. 5 such that the node 100 is equal to a low or the L level. With a low input to the two input NOR gate 108, it is equivalent to an inverter and operates as a conventional circuit illustrated in FIG. 1. Thus, X7 predecoder operates normally.

The second possible position is when a repaired main wordline is selected. First, the ground fuse is broken off to make the node 48 equal to high or the H level. Node 54 equals a high or the H level and node 58 equals a low or the L level. In this manner, the P/NMOS transmission gates are all turned on. Subsequently, the fuse of the predecoder outputs that are not selected are broken off. When the failed address code is entered, nodes 60, 62, 64 and 66 are all high or the H level. When node 76 in FIG. 4 is changed to signal line $\overline{RM}$ is connected out, as illustrated in FIG. 4, the $\overline{MWL}$ and $\overline{RM}$ are equal to low or the L level, it is equivalent to a repaired main wordline being selected.

In the repair operation, as previously stated, $\overline{MWL}$ in the redundancy circuit is turned on or the repaired main wordline is selected, the $\overline{RM}$ is low or the L level which is connected to FIG. 5 and thus make node 100 equal to a high or the H level to make the next stage NOR gate 108 output X7 $V_{cc}$ equal to low or the L level.

Figure 6:
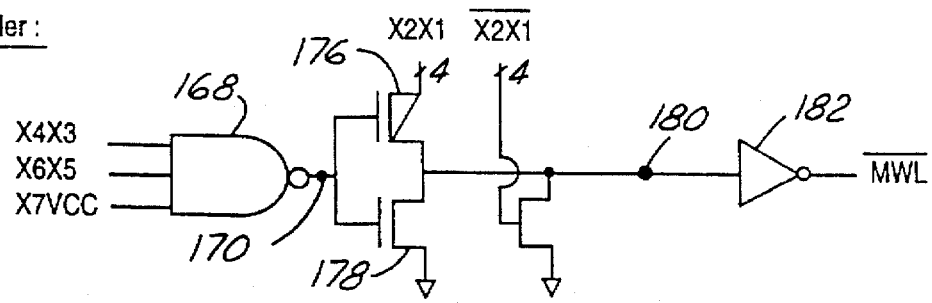
FIG. 6 is a schematic diagram of a decoder selection circuit utilizing the present invention in the selection process.

Referring now to FIG. 6, the X-decoder of the present invention is illustrated as having a three input NAND gate 168 with inputs of X4X3, X6X5 and X7$V_{cc}$ and an output node 170 bifurcating to the gates of FET's 176 and 178. The outputs of FET's 176 and 178 are connected through node 180 to inverter 182. The output of inverter 182 is the $\overline{MWL}$ signal. When NOR gate 108 has an output X7$V_{cc}$ equal to low or the L level, one input to the three input NAND of FIG. 6 is low. Thus, the next stage of the X-decoder, inverter has an output of a high or the H level. The signal of the node 180 is low or the L level such that the $\overline{MWL}$ is a high or the H level. Therefore, all the main wordlines are disabled.

Figure 7:
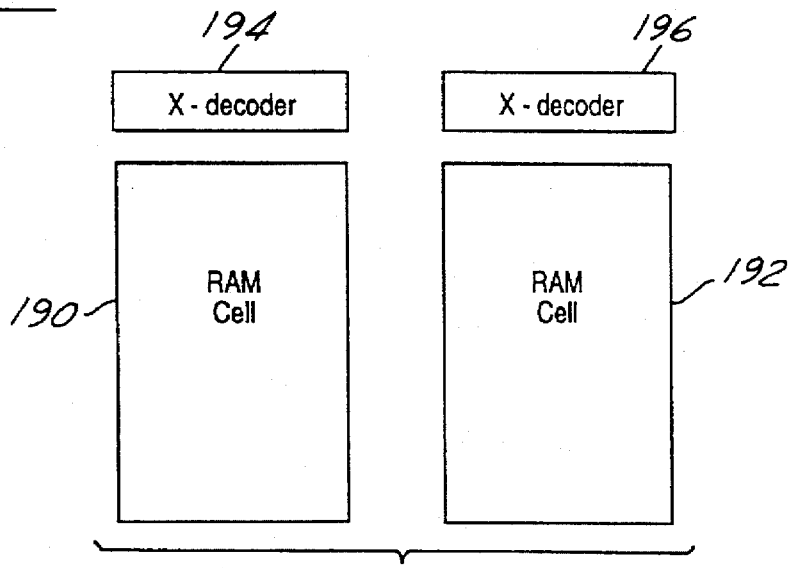
FIG. 7 is a diagram illustrating the location of the decoder circuit portion of a RAM chip without the required space for fuses.

The final architecture of a RAM chip using the present invention is as illustrated in FIG. 7. FIG. 7 illustrates a two page RAM chip with RAM cells 190 and 192, each having X-decoder circuits 194 and 196, respectively. As illustrated, X-decoder circuits 194 and 196 can be appreciably smaller than those of the prior art since the fuse circuits have been eliminated.

The length of the fuse layout is approximately 25 μm or the equivalent of 1.0 mil. Therefore, when a fuse in the X decoder is saved, a length of 1.0 mil is saved on the chip.

While there has been illustrated and described a particular embodiment of the present invention, it will be appreciated that numerous changes and modifications will occur to those skilled in the art, and it is intended in the appended claims to cover all those changes and modifications which fall within the true spirit and scope of the present invention.

I claim:

1. An apparatus for effecting replacement of main circuits with redundancy circuits in a solid state memory chip using logic circuits instead of fuse circuits, comprising:

a predecoder comprising:

first inverter means for receiving a first signal having a first state indicating whether a predetermined main circuit is selected and providing an output inverting said first signal to a second state;

second inverter means connected to the output of said first inverter means for providing an inverted output of said output of said first inverter means to restore said first signal to said second state;

third inverter means connected to the output of said second inverter means for providing an inverted output of said output of said second inverter means to output said first signal in said second state;

first circuit means for receiving inputs, indicative of whether a main circuit is selected and comprising a first fixed input and a second varying input having a first enabling state and a second disabling state, and providing an output having an enabling state and a disabling state; and second circuit means for receiving a first input from the output of said third inverter means and a second input from the output of said first circuit means and providing an enabling output whenever the output of said first circuit means is in the enabling state indicating the main circuit is selected and a disabling output whenever the output of said first circuit means is in the disabling state indicating the main circuit is to be replaced; and a decoder comprising:

fourth inverter means for receiving as an input said enabling and disabling outputs from said second circuit means and providing an output inversely indicative of said enabling and disabling outputs; and fifth inverter means for receiving said output of said fourth inverter means and providing a signal indicating whether to replace said main circuit with a redundancy circuit.

2. The apparatus according to claim 1 wherein said first circuit means includes a NAND gate.

3. The apparatus according to claim 1 wherein said second circuit means includes a NOR gate.

4. The apparatus according to claim 1 wherein said second inverter means includes a bifurcated output comprising a first connection to a means for directly outputting said first signal in said first state and a second connection to said third inverter means.

5. The apparatus according to claim 1 wherein said fourth inverter means comprises a three input NAND gate.

6. A system for effecting replacement of defective main circuits in a solid state memory chip comprising:

inverter means for receiving a first signal indicating whether a predetermined main circuit is selected and providing an inverted output of said first signal;

first circuit means for receiving inputs, indicative of whether said main circuit is selected and comprising a first fixed input and a second varying input having a first enabling state and a second disabling state, and providing an output having an enabling state and a disabling state; and second circuit means for receiving a first input from the output of said inverter means and a second input from the output of said first circuit means and providing an enabling output whenever the output of said first circuit means is in the enabling state indicating the main circuit is selected and a disabling output whenever the output of said first circuit means is in the disabling state indicating the main circuit is to be replaced.

7. The system according to claim 6 wherein said inverter means includes:

first inverter means for receiving a first signal indicating whether a predetermined circuit is selected and providing an inverted output of said first signal;

second inverter means connected to the output of said first inverter means for providing an inverted output of said output of said first inverter means; and third inverter means connected to the output of said second inverter means for providing an inverted output of said output of said second inverter means.

8. The system according to claim 7 wherein said second inverter means includes a bifurcated output comprising a first connection to a means for directly outputting said first signal in said first state and a second connection to said third inverter means.

9. The system according to claim 6 wherein said first circuit means includes a NAND gate.

10. The system according to claim 6 wherein said second circuit means includes a NOR gate.

11. The system according to claim 6 further comprising:

second inverter means for receiving as an input said enabling and disabling outputs from said second circuit means and providing an output inversely indicative of said enabling and disabling outputs; and third inverter means for receiving said output of said second inverter means and providing a signal indicating whether to replace said main circuit with a redundancy circuit.

12. The system according to claim 11 wherein said second inverter means comprises a three input NAND gate.

13. The system according to claim 7 further comprising:

fourth inverter means for receiving as an input said enabling and disabling outputs inversely indicative of said enabling and disabling outputs; and fifth inverter means for receiving said output of said fourth inverter means and providing a signal indicating whether to replace said main circuit with a redundancy circuit.

14. The system according to claim 13 wherein said fourth inverter means comprising a three input NAND gate.

15. A method for effecting replacement of defective main circuits in a solid state memory chip comprising the steps of:

receiving a first signal indicating whether a predetermined main circuit is selected;

providing an inverted output of said first signal;

receiving inputs indicative of whether a main circuit is selected and comprising a first fixed input and a second varying input having a first enabling state and a second disabling state;

providing an output having an enabling state and a disabling state in accordance with said states of said second varying input;

receiving as a first input the inverted output of said first signal and as a second input the output having an enabling state and a disabling state; and providing, in response to said first and second inputs, an enabling output whenever an enabling state indicates the main circuit is selected and a disabling output whenever a disabling state indicates the main circuit is to be replaced.

16. The method according to claim 15 further comprising the steps of:

receiving as an input said enabling and disabling outputs and providing an output inversely indicative of said enabling and disabling outputs; and receiving said inversely indicative output and providing a signal indicating whether to replace said main circuit with a redundancy circuit.

17. The method according to claim 16 wherein the step of receiving as an input said enabling and disabling outputs and providing an output inversely indicative of said enabling and disabling outputs is performed by a three input NAND gate.

18. The method according to claim 15 wherein the steps of receiving inputs and providing an output having an enabling state and a disabling state is performed using a NAND gate, and the steps of receiving a first input and a second input and providing an enabling output and a disabling output is performed using a NOR gate.

* * * * *